United States Patent
Ohno et al.

(10) Patent No.: US 6,690,284 B2
(45) Date of Patent: Feb. 10, 2004

(54) METHOD OF CONTROLLING IC HANDLER AND CONTROL SYSTEM USING THE SAME

(75) Inventors: Tomonori Ohno, Yokosuka (JP); Mitsugu Kurihara, Yokohama (JP)

(73) Assignee: Daito Corporation, Kanagawa (JP)

( * ) Notice: Subject to any disclaimer, the term of this patent is extended or adjusted under 35 U.S.C. 154(b) by 0 days.

(21) Appl. No.: 10/084,500

(22) Filed: Feb. 28, 2002

(65) Prior Publication Data

US 2002/0080041 A1 Jun. 27, 2002

Related U.S. Application Data

(63) Continuation-in-part of application No. 09/651,572, filed on Aug. 28, 2000, now Pat. No. 6,384,734.

(30) Foreign Application Priority Data

Dec. 31, 1998 (JP) ............................. 10-378549

(51) Int. Cl.[7] .............................................. G08B 21/08
(52) U.S. Cl. ...................... 340/679; 324/757; 324/754; 73/720
(58) Field of Search .................. 340/679, 674, 340/540; 324/757, 754; 73/727, 720

(56) References Cited

U.S. PATENT DOCUMENTS

| 4,993,266 | A | * | 2/1991 | Omura et al. ................ 73/720 |
|---|---|---|---|---|
| 5,285,946 | A | | 2/1994 | Tomigashi et al. |
| 5,469,953 | A | * | 11/1995 | Igarashi et al. .......... 198/345.2 |
| 5,568,032 | A | | 10/1996 | Wakui |
| 5,814,733 | A | | 9/1998 | Khoury et al. |
| 5,818,247 | A | | 10/1998 | Pyun |
| 5,951,720 | A | * | 9/1999 | Arakawa et al. ........... 29/25.01 |
| 6,076,737 | A | * | 6/2000 | Gogami et al. ............. 235/492 |
| 6,160,410 | A | * | 12/2000 | Orso et al. .................. 324/757 |
| 6,184,675 | B1 | * | 2/2001 | Bannai .................... 324/158.1 |
| 6,384,734 | B1 | * | 5/2002 | Ohno et al. ................. 340/679 |

FOREIGN PATENT DOCUMENTS

| GB | 2171978 | 9/1986 |
|---|---|---|
| JP | 5-259242 | 10/1993 |
| JP | 6-25724 | 4/1994 |
| JP | 7-55879 | 3/1995 |
| JP | 8-292230 | 11/1996 |
| JP | 9-89983 | 4/1997 |
| JP | 10-227834 | 8/1998 |

* cited by examiner

*Primary Examiner*—John Tweel
(74) *Attorney, Agent, or Firm*—Nixon & Vanderhye P.C.

(57) ABSTRACT

The step of comparing the pushing pressure developing when the pusher of a test hand presses an IC placed on the socket with the allowable press force calculated from the combined spring constant for the socket and IC, and the step of controlling the operation of the test hand at a pressure equal to or lower than the allowable press force on the basis of the result of the comparison are provided.

11 Claims, 6 Drawing Sheets

$\gamma = \Delta L / L \times 100$ (%)

METHOD OF CONTROLLING IC HANDLER AND CONTROL SYSTEM USING THE SAME

CROSS-REFERENCE TO RELATED APPLICATIONS

This is a Continuation-in-part of application Ser. No. 09/651,572, filed Aug. 28, 2000, now U.S. Pat. No. 6,384,734 B1, issued May 7, 2002 which is a Continuation of Application PCT/JP99/07413, filed Dec. 28, 1999.

This application is based upon and claims the benefit of priority from the prior Japanese Patent Application No. 10-378549, filed Dec. 31, 1998, the entire contents of which are incorporated herein by reference.

BACKGROUND OF THE INVENTION

1. Field of the Invention

The present invention relates to a method of controlling properly an operation of a test hand in an IC handler, which presses an IC device (will be referred to as "IC" hereinafter) on a contactor of a socket according to the sorts of ICs and contactors, and a measuring and recording system.

2. Description of the Related Art

An IC handler has been in common use as a semiconductor tester. In the IC handler, an IC transferred from the IC loader is placed on the socket of the measuring section. In this state, the pusher of the test hand presses the IC against the socket to bring the contact section of the IC, such as the lead pins, into contact with the contactor of the socket. From the result of electric conduction, the tester judges whether the IC characteristic is acceptable. Then, an unloader separates the IC from the IC handler and holds it.

In recent years, the types of ICs to be tested have been diversified and consequently the types of sockets to hold them have also been diversified. Thus, the operating performance of the test hand should be changed so as to deal with the type of IC and socket. Since the semiconductor tester is requested to process many ICs in a short time, it is desirable that the IC handler should be functioned at high speed. However, the faster the processing speed becomes, the greater the impact of the pusher on the IC when the pusher is pressed against the IC held on the socket, and thus the service life of the lead pins of the IC and the socket contactor may become shorter.

To overcome those problems, a handler, which has been disclosed in Jpn. Pat. Appln. KOKAI Publication No. 9-89983, is developed. In this handler, the data of allowable contact pressure in each type of IC has been inputted in a FD (floppy disk) beforehand. When the operator specifies the type of IC, the CPU sends a signal to the control valve on the basis of the data from the FD, thereby the hydraulic cylinder pressure for driving the test hand can be adjusted.

Furthermore, Jpn. Pat. Appln. KOKAI Publication No. 10-227834 has disclosed a mechanism for making fine adjustments to the proper pressure, speed, and displacement of IC pressed into a socket according to the type of IC.

In the above methods currently in use, however, it is required to input IC handler data for each type of IC into the computer in advance. And what is more, these data may be obtained through experience based on the pin pressure per lead pin, the number of pins and the allowable displacement of the socket contactor.

However, since the IC is pressed down by the test hand as it is in a socket, it may not be assured that the values based on the specified data items are always proper. For example, as the working speed of the test hand is increased to process the IC at high speed, the impact on the IC happens and becomes larger when the test hand hits the IC package. In addition, the impact force is likely to exceed the material strength of the IC leads or socket contactor and do damage to the IC package.

As described above, with respect to an IC operation test, the conductivity of an IC has been commonly tested through a contactor provided on a test socket. As a conventional contactor, a probe type contactor using metal pins and a non-probe type contactor using conductive rubber etc. are adopted.

The probe type contactor is composed of two plungers provided on both sides of an extra fine metal tube and a compressive coil spring provided in the tube. In a test by the use of the probe type contactor, metal contact pins sustained by metal springs are employed for probes. Thus, when each probe comes into contact with a projecting solder ball on a contact surface of the IC, some problems arise.

One of the problems is a case where the impact between the solder ball and the tip of the metal contact pin in the probe does damage to the structure and/or function of the IC.

Another problem is a case where a flaw or deformation, which is produced on the surface of the solder ball when the pointed tip of contact pin hits the soft solder ball, results in the malfunction of the IC.

Still another problem is a case where a deformation and/or abrasion of the contact pin due to the numerous iterative tests taken for a long period gives ill effect to the electrical connection with the IC.

When these problems occur, the correct results cannot be expected. In addition, the problems may cause breakage of the IC, or make the service life of the contactor itself shorter.

To eliminate such defects described above, for example, a non-metal type contact probe using conductive rubber, i.e., non-probe type contactor is being developed and comes onto the market in place of the contact probe using the metal pin.

In this sort of contactor, a silicon rubber, which builds in the granular conductive material arrayed columnar, is employed for the contact probe. Since the contact probe made of the conductive rubber is thinner than a conventional socket with metal probe, damage to the surface of the solder balls on the IC can be prevented, and the breakage and abrasion of the IC can be also prevented at the contact with the contactor. In addition, there is an advantage in that the deformation and abrasion of the solder balls can be diminished.

However, there are some weak points in the non-probe type contactor as follows. Since the contactor body is thin, 0.4 mm, for example, its deflection is smaller than that of the coil spring. As the deflection increases, the reaction force of silicon rubber increases in a non-linear manner. When the deflection becomes larger, the array of granular conductive material in the contactor may be broken due to the excessive deformation of rubber.

In general, even if an elastic body is compressed and deformed by the applied pressure, the body is restored to the original size when the external pressure is eliminated. However, it is known that when this deformation and restoring are repeated for many times, the restorability of the elastic body deteriorates gradually and thus the residual deformation increases. In particular, the conductive rubber has a physical feature that its restorability after compression deteriorates earlier than the metal coil spring.

As a rule, when the restorability of the non-metal type or conductive rubber type contact probe is evaluated to be deteriorated, it is required to exchange the contact probe assemblies so as to work without any trouble in a test. However, the non-metal type probe is very expensive. Therefore, a frequent exchange of the contact probe assemblies will cause the increase in production cost of the IC.

In static loading tests for the non-probe type contactor, its P-γ-R (reaction force-strain-electrical resistance) characteristics can be specified in advance. However, as described before, there is a problem in that the restorability of rubber deteriorates due to the iteration of compressive loadings by the test hand and thus the deformation remains. That is, the initial P-γ-R characteristics of the non-probe type contactor changes with the increase of the number of contacting iteration with the IC in tests.

When the residual deformation exceeds the allotted value, a test cannot be executed normally. Therefore, it should be required to change an expensive assembly of non-probe type contactor when the number of contacting iterations reaches an appointed number of times.

BRIEF SUMMARY OF THE INVENTION

Accordingly, the object of the present invention is to provide an operation method and system for an IC handler to control properly the pushing pressure, operating speed and displacement of the test hand according to the types of IC and socket.

A further object of the invention is to provide a control method and system for an IC handler, through which the non-probe type contactor, e.g., a contactor made of conductive rubber, which can be used for a longer period in comparison with a conventional test, and to execute IC tests properly and at a low cost.

To achieve the foregoing object, the operating method of the working of test hand to control appropriately the pushing force, operating velocity and displacement thereof in the IC handler is invented.

In order to realize the above-mentioned object, the control method of the test hand for pushing the contact of the IC on the socket of the IC handler comprises the step of measuring data by means of sensors through the trial to press an IC on the socket repeatedly by the test hand, so as to obtain data representing the load, the acceleration or velocity, and the amount of thrusting displacement of the test hand until the stoppage thereof after the tip of the test hand contacts with the IC; obtaining the combined spring constant K of the IC socket; and determining the motion of the test hand so as to work the impact force to an IC becoming smaller than the allowable press force.

Furthermore, a control system of the present invention comprises a load sensor for detecting the press force of the test hand applied to an IC; an acceleration sensor for detecting the operating velocity or acceleration of the test hand; a displacement sensor for measuring the thrusting displacement during the time from when the test hand comes into contact with the IC until it stops; and control means for not only calculating the combined spring constant for the IC and a socket on the basis of the data items from the individual sensors, but also controlling the driving of the test hand on the basis of the individual data items so that the press force, velocity, and displacement may reach such values that make the impact force acting on the IC equal to or smaller than an allowed value and speed up the operation of the test hand to the maximum.

A method of controlling an IC handler according to another aspect of the invention, the IC handler which executes a test by pressing down an IC loaded on a test hand against a contactor formed of conductive elastic materials that denotes conductivity in a state of being compressed, comprising:

storing an initial deformation of the contactor;

measuring the residual deformation of the contactor in each test operation; and giving a warning to replace the contactor when the difference between the amount of initial deformation and that of residual deformation becomes nearly equal to the predetermined allowable amount of deformation.

For example, an IC to be tested is put on a socket and is pressed through the test hand, and the reaction force P against compression and an amount of thrusting displacement D are detected by using sensors provided on the test hand, and then the pressure force and a stroke of the test hand can be determined so that the detected data become equal to or lower than the predetermined allowable values Pa and δa. Furthermore, the position data HC where the IC starts to be pressed is detected, and the difference Z between the HC and an initial value H0 (=H0−HC) is examined whether it is equal to or lower than an allowable amount of residual deformation Za.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
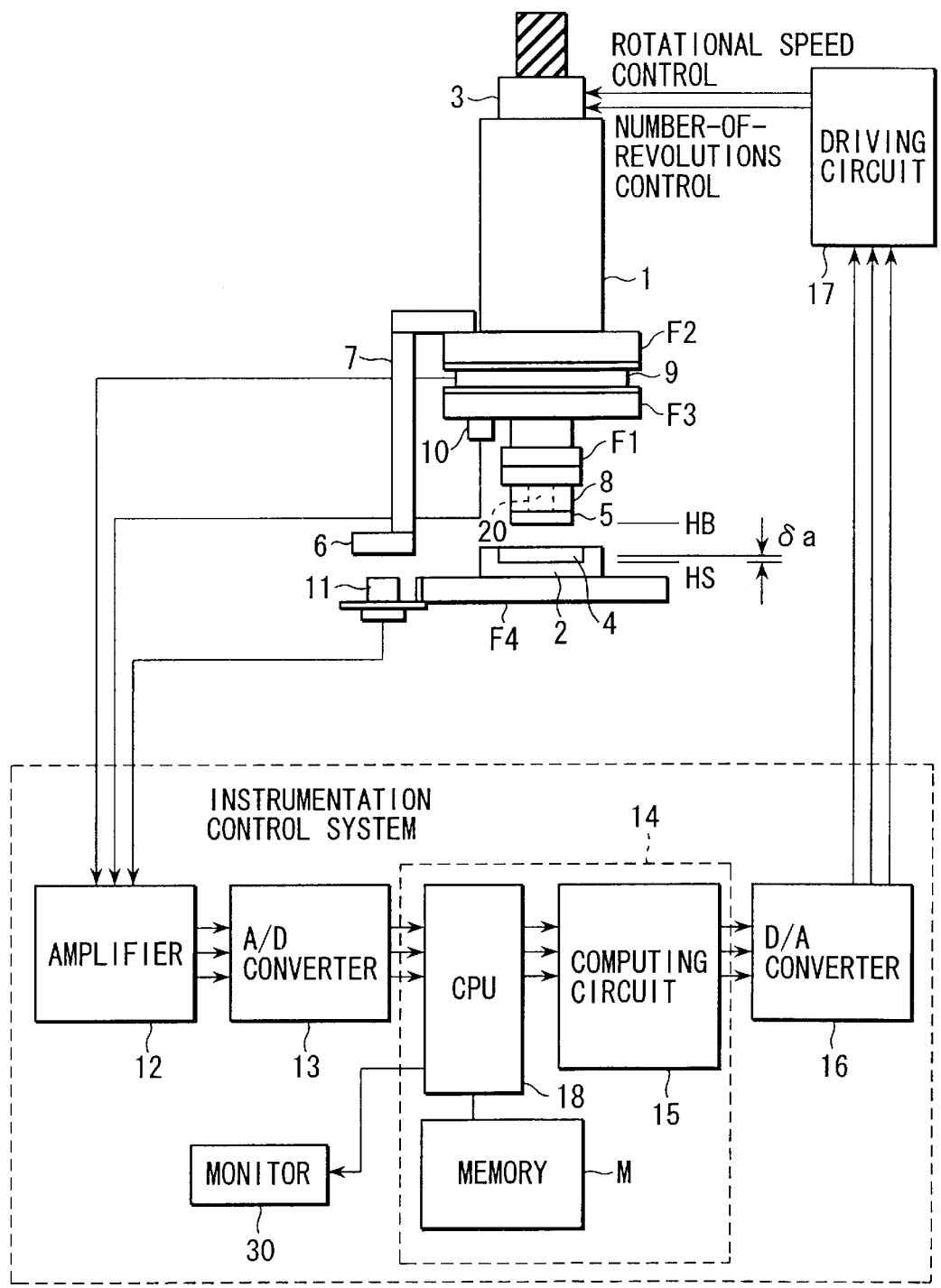
FIG. 1 illustrates a schematic block diagram of a test hand control system according to an embodiment of the present invention.

FIG. 1 is a block diagram showing the overall configuration of a control system for the test hand in an IC handler according to an embodiment of the present invention.

The upper half of FIG. 1 schematically shows an IC test section composed of a pulse motor 3, a driving circuit 17, a test hand 1, a pusher 8, an IC 5, a contactor 4, and a socket 2. At the tip of the test hand 1, a load sensor 9 using a strain gauge load transducer and a strain gauge accelerometer 10 are provided. A non-contacting displacement sensor 11 using an eddy-current displacement measuring device is provided on a frame F4 that supports the socket 2. A lightweight, rigid aluminum arm 7 to hold a target 6 of the displacement sensor 11 is provided above the pusher 8.

The lower half of FIG. 1 shows a system for collecting and processing the electric signals sent by the sensors 9 to 11. The control system is composed of an amplifier 12, an A/D converter 13, a computer 14, and a D/A converter 16. The electrical signals are digitized by the A/D converter and then the arithmetic process is executed by a computer. When the operation of the pulse motor 3 has to be adjusted, a control signal is sent to the driving circuit 17. Detailed explanation will be given below.

In FIG. 1, the pulse motor 3 is fixed on the top end of test hand body 1. At the lower end of the test hand body 1, the pusher 8 is provided in such a manner that it can move up and down freely. At the tip of the pusher 8, a suction hole 20 for causing the IC 5 to adhere to the tip by suction at air pressure is made. The suction hole 20 is connected to a compressor (not shown) via an air hole made inside the pusher 8 and test hand body 1.

Because the support plate F1 is joined to the pulse motor 3 and the pusher 8 is fixed onto the support plate F2 via a load sensor 9 and a frame F3, the pusher 8 and support plates F2, F3 are moved up and down as one piece by the pulse motor 3.

On the other hand, the socket 2 on the frame F4 is provided below the pusher 8. The contactor 4 is provided at the IC acceptor of the socket 2 so that it may touch the contacts of the IC 5, such as the leads.

The sensor arm 7, made of lightweight aluminum, is fixed rigidly to the frame F2. At the lower end of the sensor arm 7, the target 6 for a displacement sensor is provided in such a manner that it faces the displacement sensor 11 provided on the frame F4 on which the socket 2 is placed.

The acceleration sensor 10 is provided onto the lower frame F3 of the pair of frames F2, F3.

The test hand 1 has the pusher 8 at its lower end. Adhering the IC 5 by suction at its tip, the pusher 8 is moved up and down by the pulse motor 3. The test hand 1 can adjust the pushing pressure on the IC 5 and socket 2, the working speed, and the thrusting displacement of IC by controlling the number of revolutions and rotational speed of the pulse motor 3. As described later, the test hand 1 is designed to be decelerated just before the tip of the pusher 8 comes into contact with the socket 2 so as to alleviate its impact on the IC 5 and socket 2.

The load sensor 9 is for detecting the pushing pressure of the test hand 1, or the pusher 8, on the IC 5 and socket 2. The load sensor is provided between the frames F2 and F3. The acceleration sensor 10 is used for detecting the acceleration or a change of the velocity when the test hand 1 goes down. A strain gauge sensor or piezoelectric sensor may be used as the acceleration sensor 10. An acceleration sensor can be used in place of the velocity sensor. In this case, the velocity can be obtained by differentiating numerically the digitized data of displacement by means of the computer 14. The displacement sensor 11 is for measuring the displacement D from the position just before the IC 5 stuck by suction to the pusher 8 comes into contact with the contactor 4 of the socket 2 to the position at which the pusher 8 stops after being thrust down. In the embodiment, an eddy current non-contacting measuring device is used as the displacement sensor 11.

Hereinafter, the configuration of the control system for controlling the operation of the test hand 1 will be explained by reference to FIG. 1.

The pulse motor 3 and the compressor (not shown) are connected to the driving circuit 17, which controls the number of revolutions and rotational speed of each of them.

On the other hand, the output terminal of each of the load sensor 9, acceleration sensor 10, and displacement sensor 11 is connected to the amplifier 12. The amplifier 12 amplifies the faint electrical signal, which is then converted by the A/D converter 13 into a digital signal. The digital signal is supplied to the CPU 18 of the computer 14. The computer 14, which includes a computing circuit 15 connected to the CPU 18 and a memory M, controls the operation of the entire system. The memory M includes a ROM in which the operating programs for the CPU 18 are stored and a RAM for temporarily storing the data used in the computing circuit 15 is recorded.

The output data from the computing circuit 15 is converted by the D/A converter 16 into an analog signal, which is supplied as an instruction to the driving circuit 17 for operating the pulse motor 3 and compressor.

In the above system configuration, the amplifier 12 amplifies the faint analog electric signals from the sensors 9 to 11. The A/D converter 13 digitizes the amplified analog signals and sends the resulting signals to the computer 14. According to the setting program, the CPU 18 of the computer 14 will make the computing circuit 15 to perform the arithmetic processing for comparison the measured data with the stored data in the memory M and give an instruction the test hand 1 to do an optimum work correspondingly with the types of the IC 5 and socket 2. The operator can keep watch on the monitor 30 what the process is going in every time.

Hereinafter, referring to FIGS. 3 to 6, a state where the IC 5 is pressed against the contactor 4 of the socket 2 and the configuration of the socket 2 will be explained.

Figure 3:
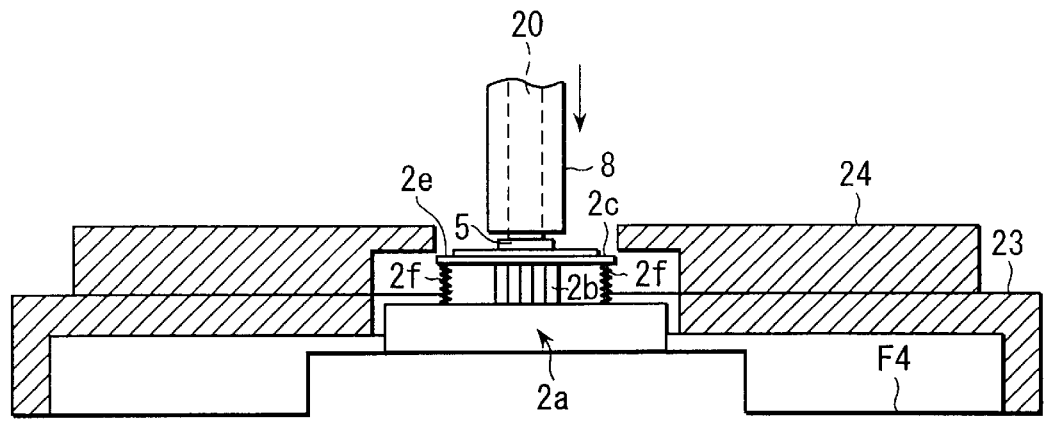
FIG. 3 shows a sectional view showing a state where the pusher provided at the tip of the test hand presses an IC against the socket.
Figures 5, 6:
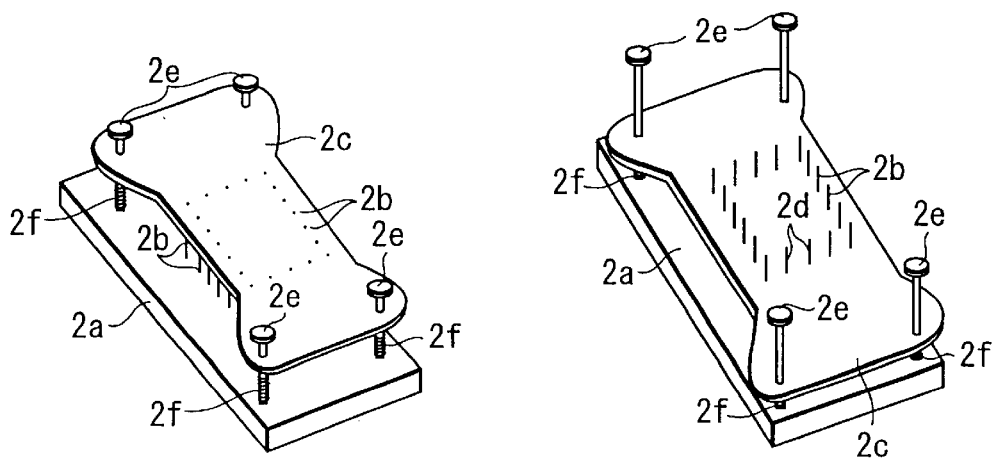
FIG. 5 shows a perspective view of an example of a socket used with the IC of FIG. 4.
FIG. 6 is a perspective view showing a state where the pusher presses down the protective plate of the socket via the IC package, causing the contact pins of the socket of FIG. 5 to project from the protective plate.

In FIG. 3, the base 2a of the socket 2 is placed on the frame F4. As shown in FIGS. 5 and 6, contact pins 2b are set straight at the base 2a. The tips of the contact pins 2b are inserted into the through holes 2a made in a protective plate 2c.

The protective plate 2c are held above the base 2a by the four supports or protective pins 2e inserted into through holes made in the four corners of the plate 2c and the coil springs 2f provided around the protective pins 2e in such a manner that the plate 2c can move up and down. As shown in FIG. 5, the coil springs 2f are normally set so that they may have such tension as raises the protective plate 2c to the extent that the contact pins 2b will not project from the surface of the protective plate 2c.

When the IC 5 conveyed by an IC loader (not shown) is stuck by suction to the tip of the pusher 8 and placed on the socket 2 and the pusher 8 presses down the IC 5 on the socket 2, the protective plate 2c which allows the contact pins 2b to project from the surface to the protective plate 2c as shown in FIG. 6, is forced to move downward. FIG. 3 shows a state where the IC 5 stuck by suction to the tip of the pusher 8 has just come into contact with the protective plate 2c.

The socket 2 put on the frame F4 is fixed and protected by covers 23 and 24.

Figure 4:
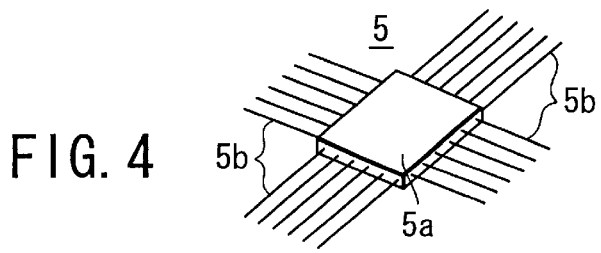
FIG. 4 shows a perspective view of an example of an IC to be tested.

As shown in FIG. 4, for example, the IC 5 has a square shape of thin flat-plate and a plural number of lead pins 5b are stuck out from each side of a plate.

In addition to the case shown in FIG. 4, there are various methods of securing an electrical connection between the IC and the socket. They include a spring contact method in which the IC's lead pins are brought into contact with the socket by the spring and a conductive rubber method in which the minute solder balls formed at one surface of the IC plate is brought into contact with the conductive particles embedded in a rubber socket (not shown).

While in the embodiment, the IC 5 is stuck by suction to the pusher 8 on the test hand 1, the IC may be placed on the socket directly from the IC loader so as to be pressed by the pusher.

The operation of the IC handler constructed as described above will be explained.

First, using the data from the sensors 9 to 11, the CPU 18 determines the pushing pressure, the allowable impact force, the working speed, and the thrusting displacement as follows.

Pushing Pressure

If the spring constant of the IC leads 5b is K1 and the resultant spring constant of coil springs 2f of the socket 2 is K2, a combined spring constant K can be obtained by adding the spring constant of the IC 5 and that of the socket 2 as follows:

$$K=(K1+K2)/K1 \cdot K2$$

Using the pushing pressure load P detected by the load sensor 9 with the pusher 8 in contact with the IC 5 and the thrusting displacement δ of the IC 5 measured by the displacement sensor 11 when the IC 5 is lowered a specific distance from the position where the pusher 8 makes contact with the IC 5 within the socket 2, the value of K is also given by:

$$K=P/\delta$$

Where, the thrusting displacement δ of the pusher 8 is the distance from the position of the pusher 8 when the acceleration of the pusher 8 changes from zero to a specific negative value at the moment the IC 5 comes into contact with the protective plate 2c to the position to which the pusher 8 is lowered a specific distance predetermined by the IC 5, or to the position at which the pusher 8 is brought to a stop by the computer 14 when the pushing pressure load P has exceeded a prescribed value. The thrusting displacement δ is the sum (δ=δ1+δ2) of the amount of deflection δ1 when the lead pins 5b of the IC 5 are pressed by the contact pins 2d of the socket 2 and the length of contraction δ2 of the coil springs 2f supporting the protective plate 2c. The values of δ1 and δ2 are determined by the spring constants K1 and K2, respectively.

Impact Force

When the IC 5 comes rapidly into contact with the protective plate 2c serving as the contactor 4, the impact force may be produced and can be evaluated from a change in the velocity (ΔV=V1−V0) of the pusher 8 during the time of Δt before and after the contact. The impulse force is given by:

$$F=m \cdot (\Delta V/\Delta t)$$

As seen from the above equation, if the velocity V0 of the pusher 8 before contact has been decreased sufficiently compared to the given working velocity of the test hand 1 and it could be kept constant until the IC 5 stuck by suction to the tip of the pusher 8 comes into contact with the protective plate 2c, the impact force at the time of contact can be extremely small or zero. In the above equation, ΔV/Δt is defined as the acceleration and it can be detected by the acceleration sensor 10.

On the other hand, the reaction force generated by the contact of the IC 5 with the socket protective plate 2c is equal to the pushing force P applied to the IC 5. The force P is detected by the load sensor 9 (load cell) provided above the pusher 8. Let the mass of the pusher 8 at the tip of the test hand 1 m, the impact force F can be evaluated as the product of m and acceleration as shown in the above equation.

Working Velocity

The working velocity V(t) of the pusher 8 of the test hand 1 at a given time t can be evaluated from either the displacement data D(t) measured by the sensor 11 or the acceleration data A(t) measured by the sensor 10 as follows:

$$V(t)=\{D(t)-D(t-\Delta t)\}/\Delta t$$

$$V(t)=V(t-\Delta t)+A(t) \cdot \Delta t$$

Thrusting Displacement

The thrusting displacement δ(t) can be obtained from the data D(t) measured by the displacement sensor 11 as follows:

$$\delta(t)=D(t)-D(t-\Delta t)$$

On the other hand, the following data items have been inputted into the memory M of the computer 14 in advance:

(1) The working velocity V of the test hand 1 (pusher 8). This is determined by the number of revolutions and rotational speed of the pulse motor 3.

(2) The braking position HB and position to be stopped HS (see FIG. 1) of the test hand 1.

(3) The decreased velocity V0 of the pusher 8 after braking. This can be determined by regulating the number of revolutions and rotational speed of the pulse motor 3.

(4) The allowable thrusting displacement δa (the amount of displacement from the position where the IC 5 comes into contact with the protective plate 2c of the socket 2 to the position where the pusher 8 stops).

(5) The allowable pushing force Pa (evaluated from the thrusting displacement δ of the pusher 8 and the combined spring constant K).

Figure 2:
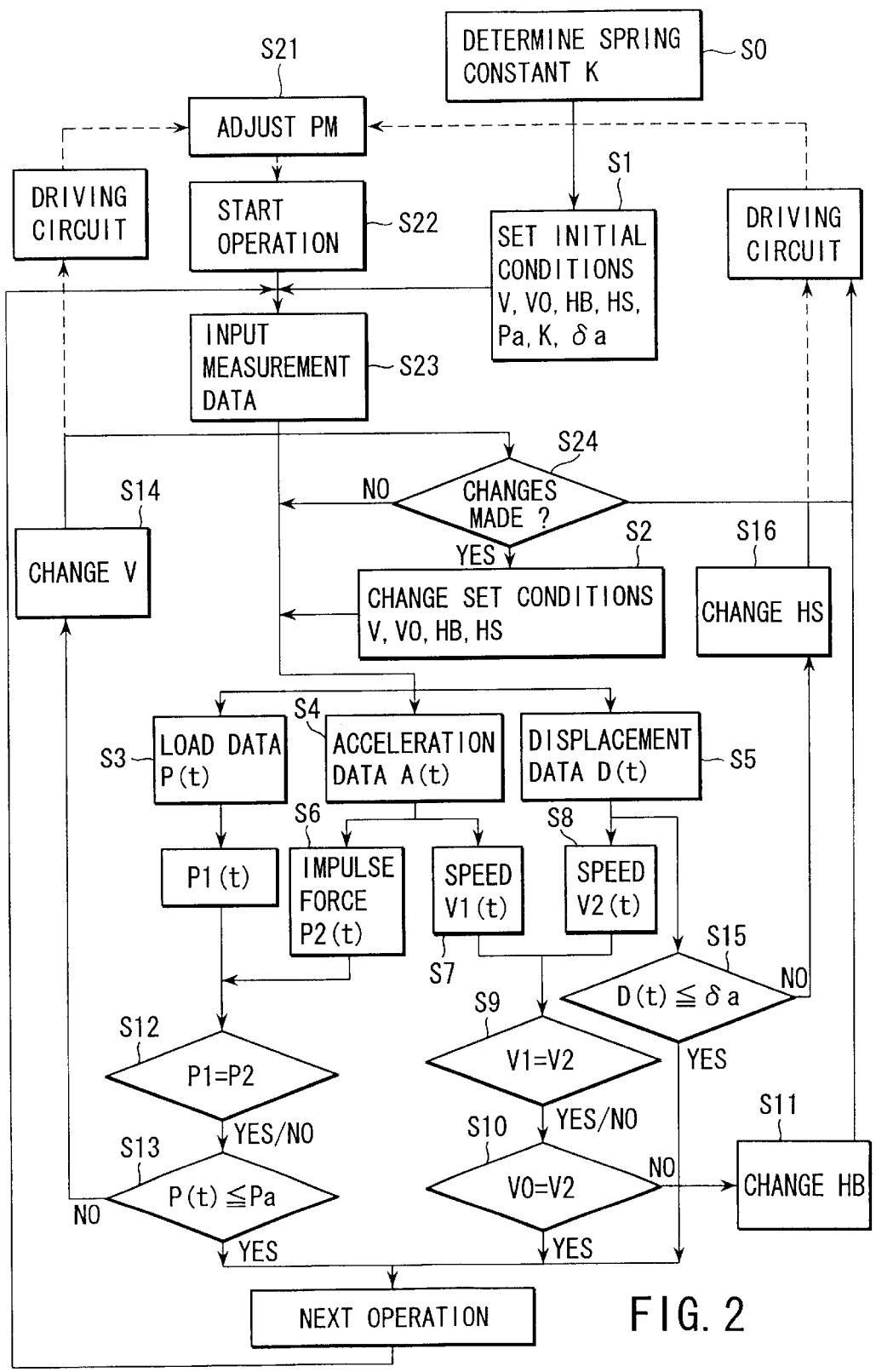
FIG. 2 shows a flowchart to explain the operation of the computer in the embodiment of FIG. 1.

The data processing and computing processes carried by the CPU 18 will be explained by reference to the flowchart of FIG. 2.

First, the pusher 8 of the test hand 1 presses repeatedly the IC 5 against the contactor 4 of the socket 2 or the protective plate 2c to measure the load P and displacement D, and then calculates the combined spring constant K of the IC 5 and socket 2 (step S0). The pushing pressure is set under the prescribed value given to the IC 5 and socket 2. Pressing the IC 5 more than once and averaging the results will minimize errors in the measured data of load P and displacement D, and then the more precise data may be obtained.

In the next step S1, the initial conditions, including the operating velocity V of the test hand 1, the braking position HB and the position to be stopped HS of the test hand 1, the decreased velocity V0 after braking, the allowable thrusting displacement δa, and the allowable pushing pressure Pa, are inputted together with the combined spring constant K obtained at step S0 into the memory M.

If necessary, the pulse motor 3 driven by the driving circuit 17 is adjusted at step S21.

After preparations for startup have been made, the operator turns on the start switch at step S22, which starts the control operation. Then, the pulse motor 3 rotates at high speed and the pusher 8 of the test hand 1 moves downward rapidly from the initial position. The CPU 18 checks the number of revolutions of the pulse motor 3 by counting the number of pulses sent from the driving circuit 17. When the number of pulses has amounted to the number corresponding to the braking position of the test hand 1, the CPU 18 sends the driving circuit 17 an instruction to brake the pulse motor 3.

At this stage, the CPU 18 takes in the input data from the sensors 9 to 11 at step S23. As a result, load data P(t), acceleration data A(t), and displacement data D(t) at time t are stored in the memory M at steps S3, S4, and S5, respectively.

Using acceleration data A(t) taken in at step S4, the decreased velocity V1(t) of the pusher 8 is determined at step S7. At the same time, using displacement data D(t) taken in at step S5, the alternative decreased velocity V2(t) of the pusher 8 is determined at step S8.

A check is made to see if the velocity V1(t) is equal to the velocity V2(t) at step S9. If the difference between them is within the allowable error range, one of the velocity data items, for example, V2(t) is compared with the initial velocity V0 after braking set at step S10. If the difference between them is within the normal range, the next operation will be proceeded.

When the measured velocity is larger than the initial set value V0, the change of the braking position HB is set at step S11. Then, the control proceeds from step S24 to step S2, where the braking position HB is changed to a position closer to the socket S2.

After the braking position HB has been changed, the data is taken in again and the velocity are compared at steps S4, S5, S7, S8, S9, and S10.

On the other hand, in parallel with this, the contact pressure force P(t) between the IC 5 and socket 2 is measured directly by the load sensor 9 at step S3. This measured load is assigned to P1(t). At step S6, the contact pressure force P(t) is calculated from the mass m of the pusher 8 and the acceleration A(t). The result of the calculation is P2(t). P1(t) is compared with P2(t) at step S12. Even when they are equal or differ slightly, the load, for example, P1 is compared with the allowable pushing pressure Pa in the memory M at step S13.

As a result, when P(t)≦Pa, or when the impact force is within the allowable range, the next operation is to be continued. If P(t) is larger than Pa, the number of revolutions or rotational speed V of the pulse motor 3 is decreased at step S14, and then control returns to step S24.

Furthermore, the displacement data D(t) obtained at step S5, which is the thrusting displacement of the IC 5 to the socket 2, is compared with the allowed value δa in the memory M. When D(t) exceeds δa, the change of the stop position HS of the pusher 8 of the test hand 1 is set at step S16, and control returns from step S24 to step S2. The change of HS is made by changing the stroke of the pusher 8 of the test hand 1, or the total number of revolutions from the start to stop of the pulse motor 3.

Watching the monitor 30 connected to the CPU 18, the operator can verify whether the operating speed of the pusher 8 is proper at step S10 or whether the operating states at steps S13 and S15 are acceptable. Therefore, when the original set values are proper, the operator uses them as they are, whereas when they are improper, the operator corrects them. Furthermore, the capability of the test hand 1 to process the IC 5 can be maximized by increasing the operating speed V of the test hand 1 in the range that meets the requirements at steps S13 and S15. Since the IC 5 stuck by suction to the pusher 8 at the tip of the test hand 1 comes into contact with the socket 2 and is slowed down to V0 immediately before it is lowered further, the impact force can be limited considerably even when the operating speed V is somewhat large.

As described above, the test hand can be operated properly in a short time even with different types of ICs and sockets by incorporating the control method and instrumentation control system of the present invention into an IC handler.

A method of controlling an IC handler according to the first aspect of the present invention and a control system using the method are used to cause a contact provided at the surface of an IC device to make good contact with the test probe of a semiconductor test unit in testing the IC device. The invention enables the operation to be performed quickly and accurately, which enables a large number of IC devices to be tested rapidly and accurately at the time of shipment.

Hereinafter, an operation method and system for an IC handler according to another embodiment of the invention will be explained by referring to FIG. 7 to FIG. 11.

Figure 7:
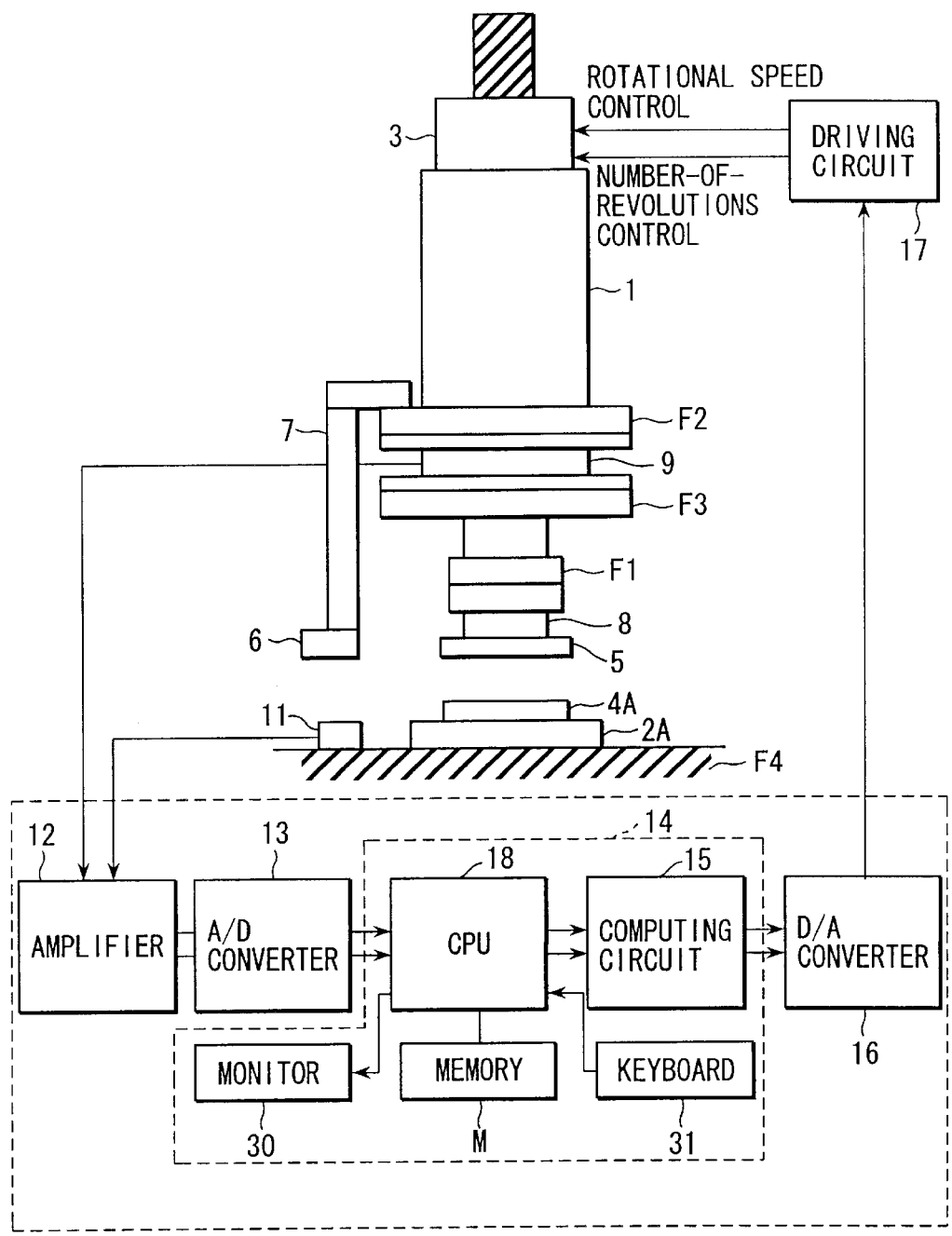
FIG. 7 is a block diagram showing the overall configuration of a control system for the test hand which executes an IC test by a non-probe type contactor made of conductive rubber.

FIG. 7 is a block diagram showing the overall configuration of a control system for the IC handler according to a second embodiment of the invention. That is, FIG. 7 shows the overall configuration of the test hand 1 and an instrumentation control system.

The test hand 1 is moved up and down by the pulse motor(PM) 3 holding the IC 5 by air suction through the pusher 8 at its lower end. A non-probe type contactor 4A is placed on an IC receiving section of a socket 2A fixed on a frame F4.

In addition, by controlling the number of revolutions and rotational speed of the pulse motor, it is easy to adjust the pushing pressure of the pusher 8 on the IC 5 and contactor 4A, the operating speed, and the thrusting displacement of IC 5 after the contact of contactor 4A with the IC 5. As described later, the test hand 1 is designed to be decelerated just before the pusher 8 comes into contact with the contactor 4A so as to alleviate its impact on the IC 5 and contactor 4A..

As shown in FIG. 7, a measuring system according to the present embodiment consists of the load sensor 9, displacement sensor 11, amplifier 12, A/D converter 13, computer 14 (CPU 18 and computing circuit 15), D/A converter 16, and driving circuit 17. The computer 14 further comprises a display or a monitor 30 and a keyboard 31 connected with the CPU 18.

The load sensor 9 is provided between the frames F2 and F3 for detecting the pushing pressure of the test hand 1 on the IC 5 and contactor 4A. In the embodiment, a strain gauge type load transducer (a load cell) is installed above the pusher 8 as the load sensor 9. The pusher 8 is provided on the frame F1.

The displacement sensor 11 fixed to frame F4 is for measuring the displacement from the position just before the IC 5 stuck by suction to the pusher 8 comes into contact with the contactor 4A of the socket 2A to the position at which the pusher 8 stops after being contacted and thrust down. In the embodiment, an eddy current non-contacting measuring device is used as the displacement sensor 11 with respect to a target 6 of the displacement sensor 11. The target 6 built in an arm 7 is fixed on the frame F2.

The amplifier 12 amplifies the faint electrical signal supplied from each sensor 9, 11 and outputs the amplified signal. The A/D converter 13 then converts the amplified signal into a digital signal and transmits the digital signal to the CPU 18. The CPU 18 of the computer 14 operates the detected data and data stored in a memory M in accordance with a setting program in a computing circuit 15, so as to determine whether the operation of the test hand 1 is proper. When the operation is proper, the CPU 18 also gives instructions to change the operation.

In addition, in accordance with the detected residual deformation of the contactor 4A, it is warned on the monitor 30 that the contactor 4A needs to be changed. The contents and numeric values of these warnings are displayed on the monitor 30 provided in the computer 14 and the operator can monitor. More over, the operator can input necessary instructions to the CPU 18 using the keyboard 31.

The D/A converter 16 converts the digital signal supplied from the computer 14 into an analog signal, and supplies the converted signal to the driving circuit 17. And then the driving circuit 17 transmits a driving signal to the pulse motor 3.

Using the loading data and displacement data from the sensors 9 and 11, the CPU 18 determines the proper operating speed and the thrusting displacement for the test hand 1 as follows.

Operating Speed

The operating speed V(t) of the test hand 1 at a given time can be found by using displacement data D(t) obtained by the displacement sensor 11 as follows.

$$V(t)=\{D(t)-D(t-\Delta t)\}/\Delta t$$

Thrusting Displacement

The thrusting displacement δ (t) is found by using displacement data D(t) obtained by the displacement sensor 11 as follows:

$$\delta(t)=D(t)-D(t-\Delta t)$$

Amount of Residual Deformation of the Contactor 4A

The amount of residual deformation Z(t) of the contactor 4A is found by using both data of the initial contact position H0 where the IC 5 comes into contact with the contactor 4A and the current contact position HC data as follows:

Z(t)=H0−HC

On the other hand, the following data are stored in the memory M of the computer 14 in advance.

(1) Initial operating speed V of the test hand 1 (Rotational speed of the pulse motor 3).
(2) Braking position HB and stop position HS of the test hand 1.
(3) Downward speed V0 after braking.
(4) Allowable thrusting displacement δa
(5) Allowable press force Pa.
(6) Allowable residual deformation Za of the contactor.
(7) P-γ-R characteristics of the contactor.
(8) Initial contacting position H0 of the IC with the contactor.

Figure 8:
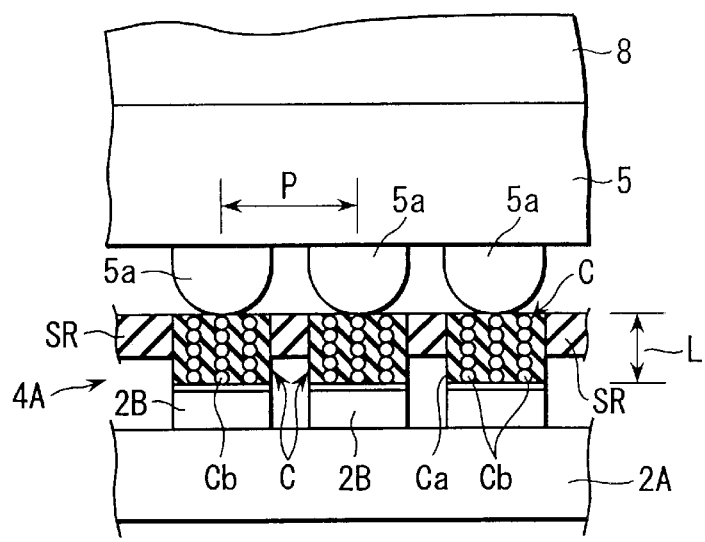
FIG. 8 is a sectional view showing a part of contactor body in the case of executing a test for an IC chip made use of a contactor formed of conductive rubber.

Next, the detailed configuration of the contactor 4A provided on the socket 2A will be explained by referring to FIG. 8. In FIG. 8, the contactor 4A has a configuration in that a plurality of contact elements C are arranged in matrix in a silicon rubber sheet SR, and is placed on the socket 2A.

Each contact element C has a structure in that a plurality of metal particles Cb are arrayed linearly in a longitudinal direction with small gaps interposed between in a silicon rubber body Ca which is formed, for example, in a column shape. These metal particles Cb are held in the body Ca in a state where the particles do not contact with each other with no pressure applied thereto from outside. The metal particles at the upper and bottom ends of the respective metal particle strings are exposed partly at the upper and bottom surfaces of the body Ca.

The metal particles exposed at the upper portion of the contact element C comes into contact with the bump 5a of the IC 5 which is stuck by suction through the pusher 8. At the lower portion of the contact element C, the metal particles at the bottom end of the line come into contact with the contacts 2B formed on the upper surface of the socket 2A. Although it is not shown, the contacts 2B are connected to each other in the inside of socket 2A for the test of the IC 5.

In the state shown in FIG. 8, L denotes the height of the contact element C in a state where no load is applied when the bump 5a of the IC 5 exactly comes into contact with the upper surface of the contact element C, and P denotes a pitch between the adjacent bumps 5a or the adjacent contact elements (pins) C.

Figure 9:
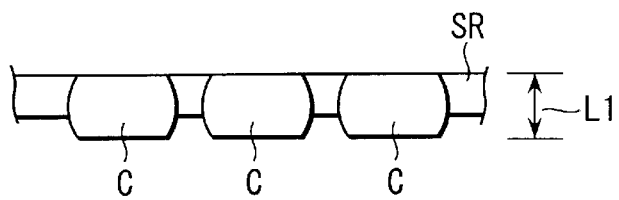
FIG. 9 is a side view showing a shape of a contactor made of conductive rubber, which is deformed by the compressive load.

In this state, when the IC 5 is pressed down through the pusher 8, the bumps 5a are pressed against the contact element C. Thus the silicon rubber body Ca is compressed by Δ L so that the height of the contact element C is compressed up to L1 as shown in FIG. 9.

Figure 10:
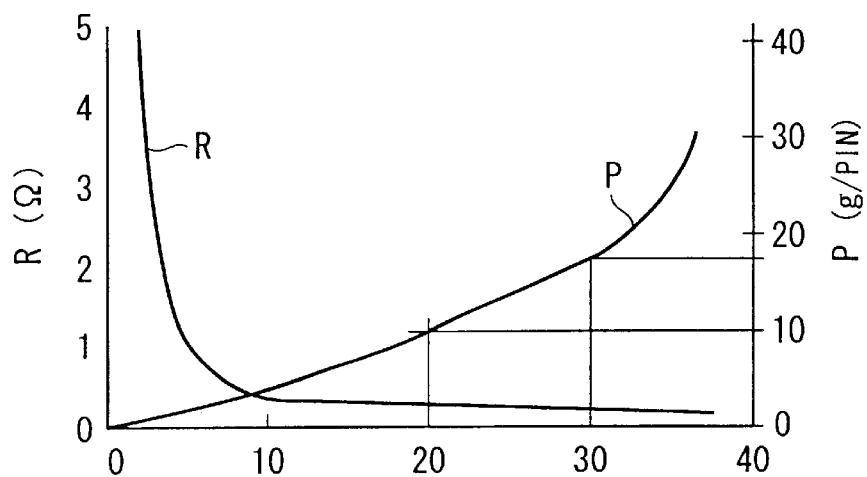
FIG. 10 is a graph showing the physical properties of conductive rubber, i.e., the relation of internal resistance vs. strain and reaction force per pin vs. strain.

FIG. 10 shows the relation between the entire resistance value R and reaction force P (g/pin) of the non-probe type contactor 4A, which is formed of a plurality of contact elements C, and the compressive strain γ expressed by the ratio of the compressed length Δ L and the initial length L in percentage.

In FIG. 10, when the compressed length Δ L or the compressive strain γ is zero, the resistance R becomes infinite and the reaction force P becomes zero. When the contact element C is slightly compressed, the resistance R is lowering rapidly. When the compressive strain γ is 10%, the resistance R becomes 0.3 Ω, for example, and the reaction force becomes 5 g. These are values for the contactor 4A to work sufficiently as the IC probe. Each of the contact elements C at this state is compressed and becomes a barrel shape having the length of L1, for example, as shown in FIG. 9.

Figure 11:
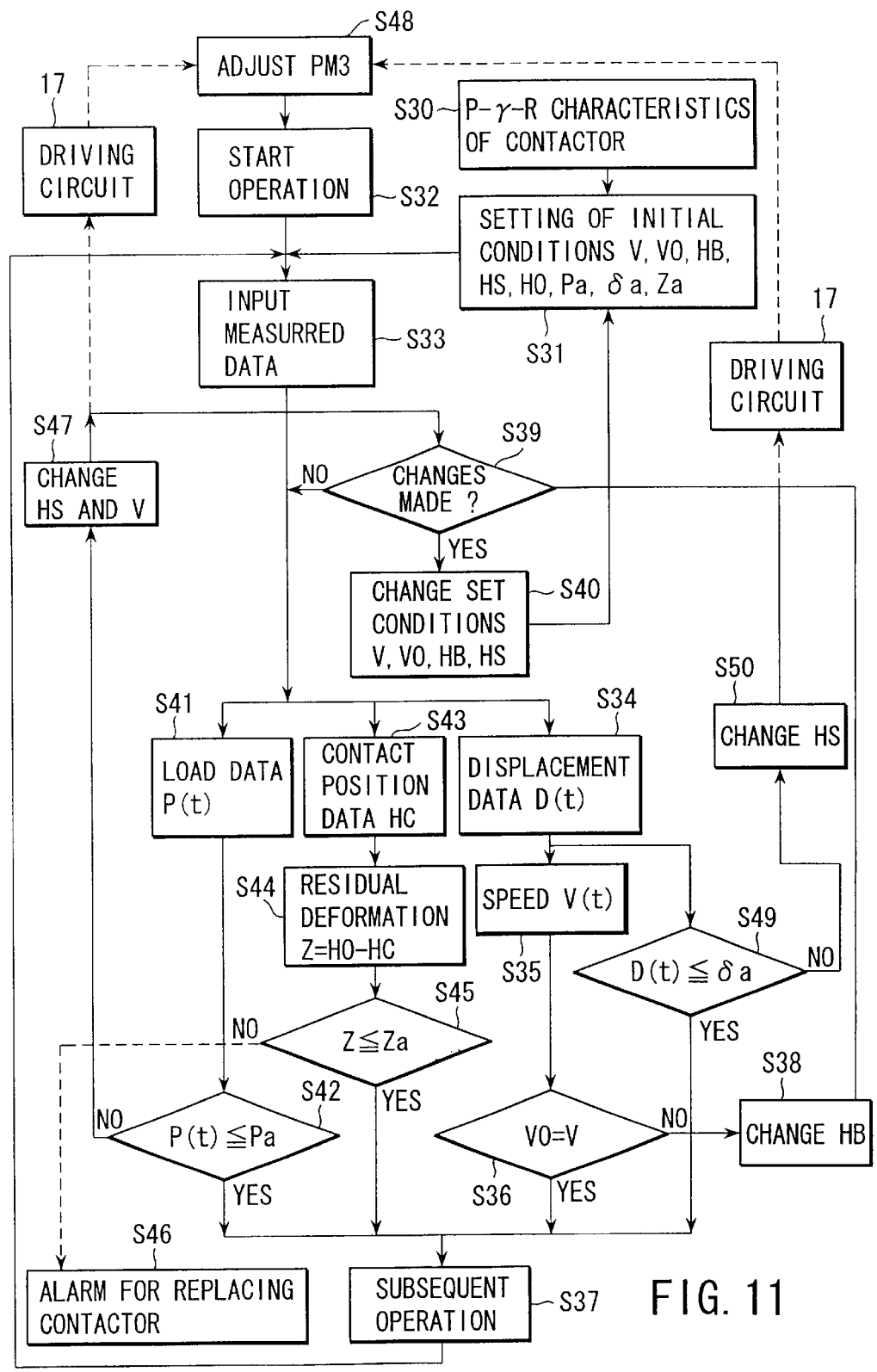
FIG. 11 is a flow chart for explaining an operation of the system described in the embodiment shown in FIG. 7.

Next, the details of data processing and operational procedure through the CPU 12 of the computer 14 according to the embodiment will be explained by referring to a flow chart shown in FIG. 11.

Now the non-probe type contactor 4A formed of conductive rubber is new and the P-γ-R characteristics thereof are shown in FIG. 10. Data of the P-γ-R characteristics are stored in a floppy disk (FD) (not shown) affixed to, for example, the contactor 4A. On installing the new contactor 4A to the socket 2A, the operator inserts the FD into a FD drive (not shown) of the computer 14 so that the memory M reads the P-γ-R characteristics data. The above operation is performed in the first step S30.

Next, through the initializing operation performed by the operator, the initial operating conditions of the test hand 1, which are stored in the memory M of the computer 14 at the step S31, are read out. Then, for example, storage data in a working area in the memory M are initialized. The initializing conditions are the followings as described before.

(1) Initial operating speed V of the pusher 8 (Rotational speed of the pulse motor 3).

(2) Braking position HB and stop position HS of the pusher 8.

(3) Downward speed V0 of the pusher 8 after braking.

(4) Allowable thrusting displacement δa of the pusher 8.

(5) Allowable press force Pa.

(6) Allowable residual deformation Za of the contactor 4A.

(7) P-γ-R characteristics of the contactor 4A.

(8) Initial contacting position H0 of the IC 5 and the contactor 4A.

Among the above conditions, the P-γ-R characteristics of the contactor 4A has already been set in the memory M at the step S30.

In this state, the operator checks that the IC 5 has been stuck by suction to the pusher 8 of the test hand 1, and then starts to work the test hand 1 at the step S32 by pressing a start button (not shown). And, the pulse motor 3 is driven at the initial operating speed V and thus the pusher 8 moves downward. The position of the IC 5 is detected by the displacement sensor 11 every moment and then the computer 14 monitors the input data from the sensor by comparing with the initial value at the step 33.

When the IC 5 comes to the braking position HB, the speed of the pusher 8 is reduced and the speed after braking is decelerated up to V0 in accordance with an instruction from the computer 14. Then, at the step S34, the displacement data D(t) of the IC 5 transmitted from the sensor 11 is obtained. By using the obtained data, the following calculation is carried out in the computer 14 at the step S35 so as to obtain the operating speed V(t) of the pusher 8.

$$V(t)=\{D(t)-D(t-\Delta t)\}/\Delta t$$

At the next step S36, it is examined whether the current speed V(t) coincides with the initial speed V0 set in the memory M. When the speed V(t) is normal, the procedure returns to the step S33 through the step S37.

When the speed V(t) does not coincide with the setting speed V0, a calculation of V(t)–V0 is made. Thus, the braking position of the pusher 8 is changed downward or upward so as to correspond with the positive or negative value at the step S38. This change is detected at the step S39, and then the corresponding setting condition, the braking position HB in this case, is corrected at the step S40, and the procedure returns to the step 31 and the content of this change is recorded.

During these procedures, the pusher 8 keeps going down at the speed of V0 after braking, and then the IC 5 stuck by suction to the tip of the pusher 8 comes into contact with the upper surface of the contactor 4A. With this contact, an output from the load sensor 9, i.e., reaction force P (t) can be detected at the step S41, and this data signal is supplied from the amplifier 12 to the computer 14 through the A/D converter 13. On receiving the load signal P (t), the computer 14 compares the current data of P(t) with the allowable press force Pa in the memory M at the step S42. When the value of P(t) is smaller than the allowable press force Pa, the procedure returns to the step S33 from the step S37. In the case where the reaction force P (t) is larger than the allowable press force Pa, the procedure goes to the step S47, and the stop position HS and the initial working speed V will be changed. This instruction to change is supplied to the driving circuit 17 of the pulse motor (PM) 3, and the number of revolutions and rotational speed of the pulse motor 3 are adjusted at the step S48.

At the same time in the above operation, the computer 14 detects the contact position HC where the IC 5 comes into contact with the contactor 4A through the output from the displacement sensor 7 at the step S43. An amount of residual deformation Z=H0−HC, which is the difference between the contact position HC and the initially set contact position H0, is obtained at the step S44. The value of Z is set to become almost zero when a new contactor 4A is installed. The amount of residual deformation Z is compared with the allowable residual deformation Za at the next step S45. When the amount of residual deformation Z is smaller than Za, the procedure goes forward to the next step S37 and returns to the step S33. When the value of Z is equal to, or larger than the value of Za, the procedure goes to the step S46 and a message for warning to replace the contactor 4A is displayed on, for example, the monitor 30.

On the other hand, when the displacement D (t) of the IC 5 is detected at the step S34, this displacement D (t) is compared with the allowable thrusting displacement δa at the step S49. When D (t)<δa is satisfied, the procedure returns to step S33 from the step S37. However, in the case of D (t)>δa, the stop position HS of the pusher 8 of the test hand 1 may be changed at the step S50. The changing instruction to the HS data is supplied to the driving circuit 17, and the number of revolutions of the pulse motor 3 is adjusted so as to correct the stop position HS at the step S48. Simultaneously, the step S50 to the step S39, are processed the setting condition HS is changed at the step S40, and then the initial condition is corrected at the step S31.

Note that, the operator can check whether the movement of the test hand 1 at the steps S36, S42, S45 and S49 are proper or not through the monitor 30. Therefore, when the initial set values are proper, they can be kept constant. When the values are not proper, they are modified.

As having been explained above, according to the second embodiment, even if the amount of residual deformation of the contactor 4A increases with the increase of the number of repeating use of the contactor 4A in tests, it is not required to replace frequently the contactor 4A if only the other testing conditions are proper. As a result, the contactor 4A can be available in tests for a much longer period than the present testing method. By installing the system for measuring and controlling into the handler, damage to both the IC and contactor itself caused by the test with the non-probe type of contactor can be prevented, and the test hand can be operated efficiently.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of controlling an IC handler that executes a test by pressing down an IC loaded on a test hand against a contactor formed of conductive elastic materials which induces conductivity in a state of being compressed, comprising:

storing an amount of initial deformation of said contactor;

measuring the amount of residual deformation of said contactor for each test operation; and giving a warning signal for replacing said contactor when the difference between the amount of initial deformation and the amount of residual deformation becomes nearly equal to the allocated allowable amount of deformation.

2. The controlling method according to claim 1, wherein said the amount of deformation is calculated in accordance with the difference between a position where a test hand exists when said contactor comes into contact with an IC and a predetermined contact position.

3. A method of controlling an IC handler that executes a test by pressing down an IC loaded on a test hand against a contactor formed of conductive elastic materials which induces conductivity in a state of being compressed, comprising:

moving an IC loaded on said test hand at a high speed to a contactor installed on a socket;

changing the moving speed of said IC to a low speed when said IC comes into contact with the contactor;

detecting a position of a test hand when the IC comes into contact with said contactor;

calculating an amount of residual deformation of said contactor from a predetermined initial contact position and said detected position;

comparing the amount of the residual deformation with the allocated allowable amount of residual deformation; and executing an IC test by using said contactor while stopping the movement of the IC when the IC is pressed down by the contactor with a predetermined pressure.

4. A method of controlling an IC handler that executes a test by pressing down an IC loaded on a test hand against a contactor formed of conductive elastic materials which induces conductivity in a state of being compressed, comprising:

recording an allowable value of reaction force in pressing the IC to the contactor installed on the socket of said IC handler;

recording an allowable amount of thrusting displacement of the IC to the contactor on said socket; and controlling reaction force at a time of pressing the IC loaded on said test hand down to the contactor and the amount of thrusting displacement to be equal to or lower than said recorded allowable amount.

5. A method of monitoring a performance of a contactor in executing a test by pressing down an IC loaded on a test hand against the contactor formed of conductive elastic materials which induces conductivity in a state of being compressed, comprising:

detecting a position of a test hand at the time when the IC comes into contact with said contactor that is not in a compressed state;

calculating an amount of residual deformation of said contactor from a predetermined initial contact position and said detected position; and giving a warning signal when the amount of residual deformation becomes nearly equal to the allocated allowable amount of deformation.

6. A recording medium used in the controlling method according to claim 4, wherein said recording medium records at least one of data denoting an allowable press force and data denoting an allowable thrusting displacement of the test hand, which are determined in accordance with the sorts of contactors to be used and ICs to be tested.

7. A controlling system of an IC handler that executes a test by pressing down an IC loaded on a test hand against a contactor formed of conductive elastic materials which induces conductivity in a state of being compressed, comprising:

a position sensor which detects a position of the test hand at the time when the IC comes into contact with said contactor that is not in a compressed state;

a computing circuit which calculates the amount of residual deformation of said contactor from a predetermined initial contact position and said detected position; and a control circuit which executes an IC test by using said contactor up to the amount of this residual deformation becomes nearly equal to the allocated amount of allowable residual deformation.

8. A controlling system of an IC handler that executes a test by pressing down an IC loaded on a test hand against a contactor formed of conductive elastic materials which induces conductivity in a state of being compressed, comprising:

means for moving an IC loaded on said test hand at high speed to a contactor installed on a socket;

means for changing the moving speed of said IC to low speed when said IC comes into contact with the contactor;

means for detecting a position of a test hand when the IC comes into contact with said contactor;

a calculating unit which calculates the amount of residual deformation of said contactor from a predetermined initial contact position and said detected position;

means for comparing the amount of this residual deformation with the allocated allowable amount of residual deformation; and means for executing an IC test by using said contactor while stopping the movement of the IC when the IC is pressed down by the contactor with a predetermined pressure.

9. A controlling system of an IC handler that executes a test by pressing down an IC loaded on a test hand against a contactor formed of conductive elastic materials which induces conductivity in a state of being compressed, comprising:

means for recording an allowable value of reaction force in pressing the IC to the contactor installed on the socket of said IC handler;

means for recording an allowable value of an allowable amount of thrusting displacement of the IC to the contactor of said socket; and means for controlling reaction force at the time of pressing the IC loaded on said test hand down to the contactor and the amount of thrusting displacement to be equal to or lower than said recorded allowable value.

10. A system of monitoring the performance of a contactor in executing a test by pressing down an IC loaded on a test hand against the contactor formed of conductive elastic materials which induces conductivity in a state of being compressed, comprising:

means for detecting a position of a test hand at the time when the IC comes into contact with said contactor that is not in a compressed state;

means for calculating the amount of residual deformation of said contactor from a predetermined initial contact position and said detected position; and means for giving an alarm when the amount of residual deformation becomes nearly equal to the allocated allowable amount of deformation.

11. A controlling system of an IC handler for executing a test by pressing down an IC loaded on a test hand against a contactor formed of conductive elastic materials which induces conductivity in a state of being compressed, comprising:

a loading sensor for detecting the press force of the test hand applied to an IC;

a displacement sensor for determining a position at the time when said test hand comes into contact with the IC and for measuring the thrusting displacement during the time from when said test hand comes into contact with the IC until it stops; and control means for not only monitoring whether the press force applying to the IC on the basis of data supplied from said loading sensor and displacement sensor is within the allowable pressure value and allowable amount of displacement, but also controlling the driving of the test hand on the basis of the individual data items.

* * * * *